(12) United States Patent
Suzuki et al.

(10) Patent No.: US 7,666,704 B2
(45) Date of Patent: Feb. 23, 2010

(54) SOLID-STATE IMAGE PICKUP ELEMENT, METHOD FOR MANUFACTURING SUCH SOLID-STATE IMAGE PICKUP ELEMENT AND OPTICAL WAVEGUIDE FORMING DEVICE

(75) Inventors: Masaaki Suzuki, Osaka (JP); Michiyoshi Nagashima, Nara (JP); Atsushi Tomozawa, Osaka (JP)

(73) Assignee: Panasonic Corporation, Osaka (JP)

( * ) Notice: Subject to any disclaimer, the term of this patent is extended or adjusted under 35 U.S.C. 154(b) by 149 days.

(21) Appl. No.: 11/912,237

(22) PCT Filed: Apr. 19, 2006

(86) PCT No.: PCT/JP2006/308196

§ 371 (c)(1),
(2), (4) Date: May 5, 2008

(87) PCT Pub. No.: WO2006/115142

PCT Pub. Date: Nov. 2, 2006

(65) Prior Publication Data

US 2009/0035887 A1    Feb. 5, 2009

(30) Foreign Application Priority Data

Apr. 22, 2005  (JP) .............................. 2005-125244

(51) Int. Cl.
H01L 21/00   (2006.01)
(52) U.S. Cl. ............................... 438/69; 438/57; 438/59
(58) Field of Classification Search .................. 438/57, 438/59, 60, 69, 72; 257/222, 225, 232, 233, 257/291, 292
See application file for complete search history.

(56) References Cited

U.S. PATENT DOCUMENTS

| | | | | |
|---|---|---|---|---|
| 5,844,290 A * | 12/1998 | Furumiya | .................... | 257/222 |
| 6,259,083 B1 * | 7/2001 | Kimura | ...................... | 257/432 |
| 6,903,395 B2 * | 6/2005 | Nakai et al. | .................. | 257/294 |
| 7,041,956 B2 * | 5/2006 | Takahashi et al. | ........... | 257/225 |
| 7,488,615 B2 * | 2/2009 | Uya | ............................. | 438/48 |
| 2004/0142501 A1 | 7/2004 | Nakai et al. | | |

FOREIGN PATENT DOCUMENTS

| | | |
|---|---|---|
| JP | 4-037165 | 2/1992 |
| JP | 10-326885 | 12/1998 |
| JP | 2001-042269 | 2/2001 |
| JP | 2002-118245 | 4/2002 |
| JP | 2002-333538 | 11/2002 |
| JP | 2003-046074 | 2/2003 |
| JP | 2003-086778 | 3/2003 |
| JP | 2004-221487 | 8/2004 |
| JP | 2004-221532 | 8/2004 |
| JP | 2005-072099 | 3/2005 |
| JP | 2005-286034 | 10/2005 |

* cited by examiner

*Primary Examiner*—Kevin M Picardat
(74) *Attorney, Agent, or Firm*—Hamre, Schumann, Mueller & Larson, P.C.

(57) ABSTRACT

A solid-state imaging device of the present invention includes a base 13, a plurality of photoelectric conversion portions 11 formed in a surface of the base 13, and an insulating film 18 formed above the base 13. Openings 18*h* are formed in the insulating film 18 so that each of the openings 18*h* is located above each of the photoelectric conversion portions 11. Optical waveguides 19 having a refractive index higher than that of the insulating film 18 are formed in each of the openings 18*h*. And the optical waveguides 19 are made of a composite material containing a resin 19*a* and inorganic particles 19*b*.

12 Claims, 8 Drawing Sheets

SOLID-STATE IMAGE PICKUP ELEMENT, METHOD FOR MANUFACTURING SUCH SOLID-STATE IMAGE PICKUP ELEMENT AND OPTICAL WAVEGUIDE FORMING DEVICE

TECHNICAL FIELD

The present invention relates to a solid-state imaging device equipped with an optical waveguide, a method of manufacturing the same, and an optical waveguide forming machine.

BACKGROUND ART

As small and light digital still cameras and cellular phones with cameras become used widely, miniaturization of pixels in a solid-state imaging device such as Charge Coupled Device (CCD) or Metal Oxide Semiconductor (MOS) type device has been promoted. With the miniaturization promoted, a light-receiving area above a light-receiving sensor portion (photoelectric conversion portion) becomes small, deteriorating the sensitivity of pixels.

To deal with such deterioration of the sensitivity, a measure in which a microlens is formed above the light-receiving sensor portion has been proposed (JP 4 (1992)-37165A). And a measure in which an optical waveguide is formed above the light-receiving sensor portion also has been proposed (JP 10 (1998)-326885A, JP 2003-46074A, JP 2004-221532A). In this measure, openings in the interlayer insulating film are formed above the light-receiving sensor portion, and optical waveguides made of a material having a higher refractive index than the interlayer insulating film are formed in the openings. The optical waveguides improve the efficiency of condensing light into the light receiving sensor portion.

As a material for making the optical waveguides, silicon nitride having a refractive index of 2.0 has been disclosed (JP 10 (1998)-326885 A). Also, diamond-like carbon (DLC) having a refractive index of about 3.0 and polyimide resin having a refractive index of about 1.7 have been disclosed (JP2003-46074 A, page 4). Also, $SiO_2$ has been disclosed (JP2004-221532 A).

However, the miniaturization of the solid-state imaging device is progressing further recently, and the area of the light receiving sensor portion is becoming smaller. Accordingly, the aspect ratio of the opening formed above the light receiving sensor portion becomes large in the solid-state imaging device equipped with optical waveguides. As a result, coverage of a high refractive index material (material for the optical waveguide) embedded in the openings deteriorates. The deterioration of the coverage may lead to air gaps such as voids in the optical waveguide being generated. When voids are formed in the optical waveguide, it causes deterioration such as reduction of sensitivity and variation of sensitivity.

Such deterioration becomes significant in the case of an optical waveguide formed by a vacuum deposition such as a silicon nitride film and a DLC film. On the other hand, in the case of an optical waveguide formed by application method, that is a polyimide resin for example, the embedding can be conducted better than that in the optical wave guide formed by a vacuum deposition. However, as the aspect ratio is getting larger, the embedding becomes more difficult.

In the meanwhile, the larger the difference between the refractive index of the optical waveguide and that of the interlayer insulating film is, the higher the light-condensing efficiency by the optical waveguide becomes. Therefore, it is preferable that the refractive index of material for the optical wave guide is as high as possible. However, the refractive index of resins is about 1.6 to 1.7 at the highest. Accordingly, a method for making the optical waveguide with a material having a higher refractive index and a better film-forming property is desired.

DISCLOSURE OF INVENTION

With the foregoing in mind, one of the objects of the present invention is to provide a solid-state imaging device equipped with an optical waveguide that has a high efficiency of condensing light into the photoelectric conversion portion and is easy to form and to provide a method of manufacturing the same. And one of the objects of the present invention is to provide a method of manufacturing a solid-state imaging device having high properties and high reliability and to provide a manufacturing machine for conducting the manufacturing method.

In order to achieve the above-mentioned objects, the solid-state imaging device of the present invention is a device that includes a base, a plurality of photoelectric conversion portions formed in a surface of the base, and an insulating film formed above the base. Openings are formed in the insulating film so that each of the openings is located above each of the photoelectric conversion portions. Optical waveguides having a refractive index higher than that of the insulating film are formed in each of the openings. And the optical waveguides are made of a composite material containing a resin and inorganic particles.

In this specification, "the refractive index of a composite material" means an effective refractive index obtained by assuming that the composite material is a medium having one refractive index. And "transparency" means that at least a part of light in the wavelength range to be detected by the photoelectric conversion portion passes through. The refractive index discussed in this specification is a refractive index at a wavelength range to be detected by the photoelectric conversion portion. When the refractive index is shown by a specific value in this specification, the refractive index is a refractive index at the wavelength of 587 nm to 632 nm.

The method of manufacturing a solid-state imaging device includes steps of (i) forming an insulating film above a base that has a surface having a plurality of photoelectric conversion portions formed therein, (ii) forming openings in the insulating film so that each of the openings is located above each of the photoelectric conversion portions, and (iii) forming optical waveguides having a higher refractive index than the insulating film in each of the openings. And the optical waveguides are made of a composite material containing a resin and inorganic particles.

The optical waveguide forming machine of the present invention is an optical waveguide forming machine for forming an optical waveguide that is used in a solid-state imaging device and is made of a composite material containing a resin and inorganic particles. The machine includes an applicator for applying a mixture containing a material for making the composite material on a specific area under reduced pressure, and a pressure controller for controlling a pressure of an atmosphere in which the mixture is applied.

In the solid-state imaging device of the present invention, the optical wave guide is made of a composite material containing a resin and inorganic particles. In the solid-state imaging device of the present invention, the light-condensing efficiency of the optical waveguide is high because the optical waveguide is made of a composite material that has a good coverage property and has a high refractive index. Therefore, the present invention can prevent the sensitivity deterioration caused by miniaturization of pixel. Furthermore, since the thermal expansion coefficient of the composite material can be made smaller than that of resins, the exfoliation of the optical waveguide caused by temperature change can be prevented.

Furthermore, the manufacturing method of the present invention can provide a solid-state imaging device that is equipped with optical waveguides having a high light-condensing efficiency and shows little variation in sensitivity. Furthermore, the optical waveguide forming machine of the present invention can form an optical waveguide that has a high light-condensing efficiency and has fewer voids.

BEST MODE FOR CARRYING OUT THE INVENTION

Figure 1A:
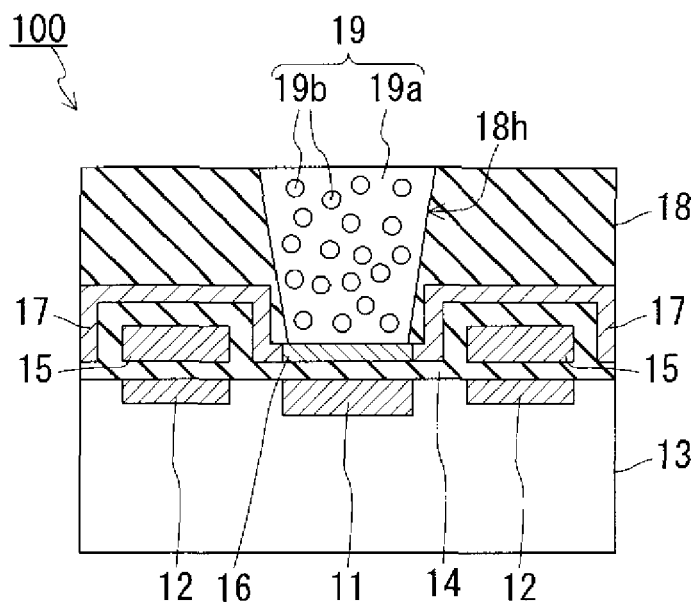
FIG. 1A is a cross-sectional view that schematically shows an example of a solid-state imaging device of the present invention.

Hereinafter, embodiments of the present invention are described. In the following description, the present invention is described with examples. The present invention, however, is not limited to the examples described below.

[Solid-State Imaging Device]

A solid-state imaging device of the present invention includes a base, a plurality of photoelectric conversion portions formed in a surface of the base, and an insulating film formed above the base. Openings are formed in the insulating film so that each of the openings is located above each of the photoelectric conversion portions. Optical waveguides having a refractive index higher than that of the insulating film are formed in each of the openings. The optical waveguides are made of a composite material (complex material) containing a resin and inorganic particles. In other words, the optical waveguides are made of a composite material having a refractive index higher than that of the insulating film. The solid-state imaging device is a device such as a Charge Coupled Device (CCD) and a Metal Oxide Semiconductor (MOS) type device.

The composite material constituting the optical waveguide is a mixture containing a resin and inorganic particles and is a transparent material. The composite material may contain other materials as long as the advantageous effects of the present invention can be obtained. The main component of the composite material is a resin and inorganic particles. The content other than the resin and inorganic particles is generally less than 10 vol. %, and is, for example, less than 1 vol. %. A typical example of the composite material is one consisting of resin and inorganic particles.

As the base, a semiconductor substrate such as a silicon substrate can be used. The photoelectric conversion portion (light sensor portion) is a portion that converts the incident light into signal charges. A well-known photoelectric conversion element such as photodiode can be used for the photoelectric conversion portion. For example, a p-n junction functioning as a photoelectric conversion portion can be formed by forming a region in a semiconductor substrate, which has a conductivity type different from that of the substrate. The wavelength range detected by the photoelectric conversion portion is not particularly limited but is generally in the range of 300 nm to 1100 nm.

The insulating film formed above the base, hereinafter also referred to as "interlayer insulating film", is made of an insulating material having a refractive index lower than that of the optical waveguide. The insulating film is made of, for example, $SiO_2$ (refractive index: about 1.45), $SiO_2$-based glass such as borophosphosilicate glass (BPSG) having a refractive index of about 1.4 to 1.5, phosphosilicate glass (PSG) and spin-on-glass (SOG).

The refractive index of the composite material is higher than that of the interlayer insulating film. To further improve the efficiency of condensing light into the photoelectric conversion portions, it is preferable that the light propagating the optical waveguide is reflected totally at the interface between the optical waveguide and the interlayer insulating film. The condition required for the total reflection can be obtained by Snell's law. Specifically, the critical angle θt at which the total reflection occurs is expressed by sin σt=n2/n1 where n1 denotes the refractive index of the optical waveguide and n2 denotes the refractive index of the interlayer insulating film. The smaller the critical angle θt is, the larger the proportion of the totally reflected light becomes, increasing the light-condensing efficiency. Therefore, it is preferable that the ratio [n1/n2] between the refractive index n1 of the optical waveguide and the refractive index n2 of the interlayer insulating film is high to increase the efficiency of condensing light into the photoelectric conversion portion.

Generally, $SiO_2$-based film having a refractive index of about 1.4 to 1.5 is used for the interlayer insulating film. Therefore, the refractive index of the composite material is preferably 1.5 or more, and more preferably 1.7 or more (for example 1.8 or more, or 2.0 or more). The upper limit of the refractive index of the composite material is not particularly limited but generally is 3 or less. The refractive index of the optical waveguide made of only resin is about 1.7 at the highest. And the refractive index of silicon nitride film made by a vacuum process is about 2.0.

When a $SiO_2$ film having a refractive index of 1.45 is used for the interlayer insulating film and the composite material having a refractive index of 1.7 is used as the material of the optical waveguide, the critical angle θt is about 58°. Also, when the composite materials having refractive indexes of 1.8 and 2.0 are used as the material of the optical waveguide, the critical angles θt are about 53° and 46° respectively.

The length L of the optical waveguide and the width W of the bottom of the optical waveguide may fulfill 1≦L/W≦5. When L/W is 1 or more and the opening in which the optical waveguide is to be formed is filled up with a composite material at normal pressure, a large void sometimes generates in the optical waveguide. On the contrary, the manufacturing method of the present invention, in which the opening is filled up with a raw material for the composite material under reduced pressure, can make the void sufficiently small and can suppress the effect of the void.

[Inorganic Particle]

To form the optical waveguide having high transparency and a high refractive index, the size and material of the inorganic particles that constitutes the composite material are important.

The diameter of the inorganic particles should be smaller than the width (the diameter or the length of side) of the optical waveguide. The width of the optical waveguide is generally about 0.5 μm to 3 μm. Therefore, the diameter of the inorganic particles is generally 0.5 μm or less. A composite material suitable for filling up the opening can be obtained by using inorganic particles having a diameter sufficiently smaller than the width of the optical waveguide.

When the diameter of the inorganic particles is sufficiently small compared with the wavelength of light, the composite material in which the inorganic particles are dispersed can be assumed to be a homogeneous medium without a variation of the refractive index. Furthermore, when the diameter of the inorganic particles is one-quarter of the light wavelength or less, the scattering in the composite material is only Rayleigh scattering, and the transparency will be enhanced. Therefore, in order to achieve high transparency, the diameter of the inorganic particles is preferably 100 nm or less. When the diameter of the inorganic particles is less than 1 nm, it may influence the property of the optical element. For example, the material exhibiting a quantum effect may cause fluorescence. Accordingly, the diameter of the inorganic particles is preferably in the range of 1 nm to 100 nm (for example, 5 nm to 50 nm). It is preferable that the diameter of the inorganic particles is substantially in the range of 1 nm to 100 nm. Here, "substantially in the range of 1 nm to 100 nm" means that 50% or more (by volume base) of whole inorganic particles (inorganic powder) contained in the composite material has a diameter in the range of 1 nm to 100 nm in the diameter frequency distribution measured by a particle size distribution analyzer.

The average diameter of the inorganic particles is, for example, in the range of 1 nm to 100 nm and may be in the range of 1 nm to 50 nm or 1 nm to 15 nm. When the average diameter of the inorganic particles is in the range of 1 nm to 15 nm, the effect of Rayleigh scattering becomes small, and the transparency of the composite material becomes especially high.

The diameter of the inorganic particles at the stage prior to forming the optical waveguide can be measured by a particle size distribution analyzer, for example. In the measurement using particle size distribution analyzer, a solution in which the inorganic particles have been dispersed (or a solution in which a raw material of the resin and the inorganic particles dispersed therein have been diluted by the solvent) is measured by a laser diffraction method or a scattering method. Then the center diameter corresponding to the cumulative frequency of 50% (volume median diameter: d50) is defined as the average diameter. Especially, light loss caused by Rayleigh scattering can be reduced by using the inorganic particles whose diameter corresponding to the cumulative frequency of 75% is in the above-mentioned range.

Furthermore, the diameter of the inorganic particles contained in the fabricated optical waveguide can be measured by the observation using an electron microscope. In this method, a picture of the organic particles in the optical waveguide is taken by using a transmission electron microscope or a scanning electron microscope, and the diameters of the particles in the picture are measured. And the simple average of these diameters, namely the value of [sum of the diameters]/[number of the particles], is defined as the average diameter. In this case, it is generally preferable to calculate the average diameter by measuring more than about two hundred inorganic particles.

The inorganic particles are made of a material having a high refractive index. For example, the refractive index of the inorganic particles is preferably 2 or more. The composite material may include only one kind of inorganic particles made of a specific material or may include several kinds of inorganic particles made of different materials.

As a material of the inorganic particles, metal oxide having a refractive index of 2 or more such as titanium oxide (refractive index: 2.2 to 2.5), tantalum oxide (refractive index: 2.0 to 2.3), niobium oxide (refractive index: 2.1 to 2.3), tungsten oxide (refractive index: 2.2), zirconium oxide (refractive index: 2.1), zinc oxide (refractive index: 1.9 to 2.0), indium oxide (refractive index: 2.0), tin oxide (refractive index: 2.0) and hafnium oxide (refractive index: 2.0) may be used. Furthermore, an oxide obtained by doping a metal element into those oxides may also be used. The inorganic particles may be made of one of those oxides or may be made of a double oxide of those oxides. Furthermore, as a material of the inorganic particles, nitrides such as silicon nitride (refractive index: 1.9 to 2.0), carbides such as silicon carbide (refractive index: 2.6), and transparent carbon compounds such as diamond (refractive index: 3.0) and diamond-like carbon (refractive index: 3.0) may also be used. Furthermore, sulfides such as tin sulfide, and metal materials such as gold, platinum, palladium, silver, copper and nickel may also be used.

The inorganic particles may contain, as a main component (content: 50 wt. % or more), at least one oxide selected from a group consisting of titanium oxide, tantalum oxide, zirconium oxide, zinc oxide, indium oxide and tungsten oxide. These inorganic particles are obtainable easily because many kinds of these particles are on the market.

[Resin]

In order to form an optical waveguide having high transparency and a high refractive index, it is preferable that the resin constituting the composite material is transparent and has a refractive index of 1.4 to 1.7. It is preferable that the resin is clear. The resin is selected considering properties such as the formability and film-forming property, which are important in filling up the openings favorably and in being planarized favorably, as well as optical properties. Furthermore, the resin is selected also considering the dispersibility of the inorganic particles. Considering that the refractive index of $SiO_2$ film, which is generally used as the interlayer insulating film, is about 1.5, the refractive index of the resin is preferably 1.5 or more.

As the resin, a highly transparent resin among thermoplastic resins, thermosetting resins and photocurable resins can be used. For example, acrylic resin such as polymethyl methacrylate; epoxy resin; polyester resin such as polyethylene terephthalate, polybutylene terephthalate and polycaprolactone; polystyrene resin such as polystyrene; olefin resin such as polypropylene; polyamide resin such as nylon; polyimide resin such as polyimide and polyetherimide; polyvinyl alcohol; butyral resin; and vinyl acetate resin may be used. In addition, engineering plastics such as polycarbonate, liquid crystal polymer, polyphenylene ether, polysulfone, polyether sulfone, polyarylate and non-crystal liquid polyolefin may also be used. In addition, a mixture or copolymer of those resins (polymers) also may be used. In addition, resins obtained by modifying those resins also may be used.

Among those resins, acrylic resin, epoxy resin, polyimide resin, butyral resin, non-crystal liquid polyolefin and polycarbonate resin have high transparency and high formability. The refractive indexes of those resins can be controlled to be in the range of 1.4 to 1.7 (preferably 1.5 or more) by selecting a specific molecular frame. Photocurable resin is easy to be fluid before curing, so it has an advantage to obtain a good dispersibility of inorganic particles and a good formability. In addition, photocurable resin has an advantage to improve mechanical stability, environment stability such as heat resistance, and the like by curing after forming.

In the solid-state imaging device of the present invention, the resin may be transparent and may have a refractive index of 1.5 or more. In addition, the inorganic particles may have a diameter substantially in the range of 1 nm to 100 nm and may be made of an inorganic oxide having a refractive index of 2 or more. In addition, the refractive index of the composite material may be 1.8 or more, and the insulating film may be made of silicon oxide having a refractive index of 1.5 or less.

The above-mentioned optical waveguide may function as a wavelength filter. In other words, the optical waveguide may transmit light selectively in a specific wavelength range. In this case, the optical waveguide may function as a color filter. Specifically, the optical waveguide may transmit light selectively in a specific visible range. Moreover, the optical waveguide may function as an infrared light cut-off filter. In other words, the optical waveguide may cut off infrared light. Color filters and infrared light cut-off filters may be omitted by using the optical waveguide functioning as a wavelength filter. In this case, a solid-state imaging device that suppresses color mixing (crosstalk) between adjacent photoelectric conversion portions and has good reliability can be obtained.

[An Example of the Solid-State Imaging Device]

Hereinafter, a CCD is described as a solid-state imaging device of the present invention. The optical waveguide described below can be applied for other imaging devices of the present invention such as a MOS-type imaging device.

FIG. 1A shows a cross-sectional view of a CCD of the present invention. FIG. 1A shows only one pixel in the CCD. The imaging device (CCD) 100 shown in FIG. 1A includes a base 13 (hatching is omitted) having a surface in which a photoelectric conversion portion (light-receiving sensor) 11 and a charge transfer portion 12 are formed, and includes an insulating layer 14, a transfer electrode 15, an antireflection film 16, a light shield film 17, an interlayer insulating film 18 and an optical waveguide 19 (hatching is omitted), that are formed on the base 13.

The base 13 is a base made of semiconductor such as silicon. In its surface, a plurality of the photoelectric conversion portions 11 are formed. Two charge transfer portions 12 are disposed so as to sandwich the photoelectric conversion portion 11. The photoelectric conversion portion 11 and the charge transfer portion 12 can be formed, for example, by doping impurities into a semiconductor substrate of a specific conductivity type.

The insulating layer 14 is made of silicon oxide ($SiO_2$) and can be formed by a thermal oxidation method or CVD. The transfer electrode 15 is disposed so as to oppose to the charge transfer portion 12 across the insulating layer 14. The charge transfer electrode 15 is made of polysilicon, for example. The signal charge obtained by photoelectric conversion at the photoelectric conversion portion 11 is read out by the charge transfer portion 12 and transferred by the transfer electrode 15.

The antireflection film 16 is a film that prevents the incident light passing through the optical waveguide 19 from reflecting. The antireflection film 16 is disposed above the photoelectric conversion portion 11. The antireflection film 16 also functions as an etching stopper layer. The antireflection film 16 is, for example, made of aluminum oxide or silicon nitride.

The light shield film 17 is formed in a region that is in the surface of the insulating layer 14 and that is not above the photoelectric conversion portion 11. The light shield film 17 is formed so as to cover the transfer electrode 15. The light shield film 17 is, for example, made of metal such as aluminum (Al) and tungsten (W).

The interlayer insulating film 18 is formed above the base 13, more specifically above the light shield film 17. The interlayer insulating film 18 serves as a planarizing film. The interlayer insulating film 18 is, for example, made of $SiO_2$ (refractive index: 1.45). An opening 18h penetrating the interlayer insulating film 18 is formed in the interlayer insulating film 18 so that the opening 18h is located above the photoelectric conversion portion 11.

The optical waveguide 19 made of a composite material of resin 19a and inorganic particles (inorganic powder) 19b is formed in the opening 18h. The refractive index of the composite material (the optical waveguide 19) is larger than that of the interlayer insulating film. The opening 18h may be subjected to a pretreatment for improving adhesiveness between the opening 18h and the composite material. For example, a surface treatment using a coupling agent or a plasma treatment may be used as the pretreatment.

Figure 1B:
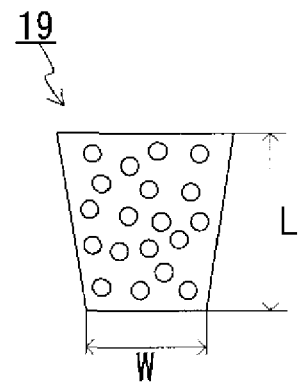
FIG. 1B shows the length L and the bottom width W of the optical waveguide shown in FIG. 1A.

The cross-sectional shape, that is parallel to the top surface, of the optical waveguide 19 (a shape obtained by viewing the optical waveguide from the upper side) is circle, rectangle or the like. The width (the diameter or the side length of the cross-sectional shape) of the optical waveguide 19 is about 0.5 µm to 3 µm, for example. The aspect ratio of the optical waveguide 19, namely the value of the ratio [length L]/[width W] between the length L (length perpendicular to the surface of the base 13) and width W of the bottom face (a face on the side of the base 13) of the optical waveguide is about 1 to 5. The cross-sectional view in FIG. 1B shows the length L and the bottom width W (size) of the optical waveguide 19.

The shape of the optical waveguide 19 is not limited to the above-mentioned shape, because it changes depending on the design of the solid-state imaging device.

FIG. 1A shows the optical waveguide 19 having a taper shape whose cross-sectional area gradually decreases from the surface side to the bottom side. The optical waveguide 19 has a truncated cone shape, namely a shape obtained by truncating a circular cone, or has a shape obtained by truncating a quadrangular pyramid. The angle between a side wall of the optical waveguide 19 and a surface of the base 13 is preferably 60° or more and less than 90°, and is more preferably 70° or more and 80° or less. The smaller this angle is, the larger the area of exposed surface of the optical waveguide 19 becomes, thereby increasing the amount of light that is brought into the photoelectric conversion portion 11. In addition, when this angle is small, it becomes easier to fill the opening 18h with the composite material so that the composite material reaches the bottom of the opening 18h.

[Composite Material]

The preparing method for the composite material is not limited. The composite material may be prepared by a physical method or a chemical method. For example, the composite material may be prepared by one of following methods (1) to (4).

(1) A method in which a resin (or solution in which a resin is dissolved) and inorganic particles having a primary particle diameter less than 1 μm are mixed in a mechanical/physical manner.

(2) A method in which inorganic particles having a primary particle diameter less than 1 μm and a raw material (such as monomer and oligomer) for a resin are mixed in a mechanical/physical manner to obtain a mixture, and then polymerizing the raw material for a resin. The polymerization may be conducted after or before applying the mixture to the opening.

(3) A method in which a resin (or solution in which a resin is dissolved) and a raw material for inorganic particles are mixed, and then reacting the raw material to form inorganic particles in the resin.

(4) A method in which a raw material (such as monomer and oligomer) for a resin and a raw material for inorganic particles are mixed, and then reacting the raw material to form inorganic particles and polymerizing the raw material for a resin to synthesize a resin.

The methods of (1) and (2) have advantageous effects that various kinds of particles formed in advance can be used and the composite material can be prepared by using a general-purpose dispersion machine. In the methods of (3) and (4), the raw materials are limited because the methods need chemical reactions. But those methods have an advantageous effect of increasing the dispersibility of inorganic particles because those methods can mix the raw materials at the molecular level.

In the above-mentioned methods, the order of mixing the inorganic particles (or a raw material for the inorganic particles) and a resin (or a raw material for a resin) is not limited and a preferable order can be selected as required. For example, a resin, a raw material for a resin, or a solution dissolving one of them may be added to a solution in which inorganic particles having a primary particle diameter substantially in the range of 1 nm to 100 nm have been dispersed, and then it may be mixed in a mechanical/physical manner.

The refractive index of a composite material consisting of a resin and inorganic particles can be estimated according to, for example, the Maxwell-Garnet theory shown in formula (1). The mixing ratio between the resin and the inorganic particles may be determined according to an estimation obtained by the theory. The actual refractive index of the composite material can be obtained by measuring the prepared composite material in a film form or a molded form using spectrometry such as ellipsometry, Abere's method, an optical waveguide method and a spectral reflection method.

[Formula (1)]

$$n_{av}^2 = \frac{n_p^2 + 2n_m^2 + 2P(n_p^2 - n_m^2)}{n_p^2 + 2n_m^2 - P(n_p^2 - n_m^2)} n_m^2 \quad (1)$$

In Formula (1), $n_{av}$ denotes the average refractive index of the composite material, $n_p$ denotes the refractive index of the inorganic particles, $n_m$ denotes the refractive index of the resin, and $n_p > n_m$. P denotes the volume fraction of the inorganic particles in the whole composite material. When the inorganic particles absorb light or are made of metal, the refractive index in Formula (1) is calculated as a complex refractive index.

When a resin having a refractive index of 1.5 is used, a composite material having a refractive index of 1.8 or more is considered to be obtained by mixing inorganic particles having a refractive index of 2.4 (for example, titanium oxide) in a volume fraction of 37% or more. When a resin having a refractive index of 1.6 is used, a composite material having a refractive index of 1.8 or more is considered to be obtained by mixing inorganic particles having a refractive index of 2.4 (for example, titanium oxide) in a volume fraction of 28% or more.

The preferable fraction (volume fraction) of the inorganic particles in the composite material varies depending on the combination of the resin and the inorganic particles. When the fraction of the inorganic particles is too large, the transparency deteriorates. Therefore, the upper limit of the fraction of the inorganic particles in the composite material is generally about 50 vol. % to 80 vol. %. To achieve a high refractive index and high transparency, the fraction of the inorganic particles in the composite material is preferably in the range of 5 vol. % to 50 vol. %.

The fractions of the resin and the inorganic particles in the composite material are determined according to the desired property of the optical waveguide and kinds of the resin and the inorganic particles. For example, the fraction of the resin in the composite material may be in the range of 50 vol. % to 95 vol. % (for example, 60 vol. % to 80 vol. %), and the fraction of the inorganic particles in the composite material may be in the range of 5 vol. % to 50 vol. % (for example, 20 vol. % to 40 vol. %).

In an example of a preferable combination of the composite material and the interlayer insulating film, the refractive index $n_m$ of the resin, the refractive index $n_p$ of the inorganic particles, the refractive index n1 of the composite material and the refractive index n2 of the interlayer insulating film fulfill $n_p > 2$, $1.8 > n_m \geqq 1.5$, $n_p > n1 \geqq 1.8$ and $1.5 \geqq n2$. As an example of such a combination, an optical waveguide composed of a composite material made of a transparent resin having a refractive index of 1.5 or more and inorganic particles (diameter: 1 nm to 100 nm) made of an inorganic oxide having a refractive index larger than 2 was formed in the interlayer insulating film made of silicon oxide (refractive index: 1.5 or less). As a result, high light-condensing efficiency was obtained and the sensitivity was improved.

In a typical example, an optical waveguide is formed by putting a composite material having a refractive index of 1.82 in an opening (diameter: 1 μm, aspect ratio: 2) formed in an interlayer insulating film made of silicon oxide (refractive index: 1.45). The composite material can be prepared, for example, by mixing acrylic resin having a refractive index of 1.58 and titanium oxide particles (diameter: about 30 nm) having a refractive index of 2.4 so that the percentage of the titanium oxide particles reaches 32 vol. %.

In the present invention, the optical waveguide is made by using a composite material. The inorganic particles contained in the composite material have a smaller thermal expansion coefficient than resins. The thermal expansion coefficient of the composite material is the middle value between the thermal expansion coefficient of the resin and the thermal expansion coefficient of inorganic particles and is smaller than that of the resin. Therefore, an optical waveguide made of a composite material has less deterioration caused by temperature change, such as exfoliation caused by thermal expansion, compared with the conventional optical waveguide made of a resin only.

The solid-state imaging device shown in FIG. 1A is an example, and the present invention can be applied to other various embodiments. For example, an on-chip lens may be formed above the optical waveguide. And the shape of the optical waveguide may be a columnar shape having a constant cross-sectional area. And the optical waveguide may have a shape whose surface contacting with the insulating layer is step-like. And a plurality of electrodes may be formed within the interlayer insulating film. And the optical waveguide also may function as a color filter.

The effect of introducing light to the optical waveguide can be improved by forming an antireflection film having a refractive index intermediate between the refractive index of the optical waveguide and the refractive index of air. In this case, the thickness of the antireflection film is 400 nm or less, preferably 200 nm or less. The refractive index of the film is 1.7 or less, preferably 1.5 or less. As the antireflection film, a $SiO_2$ film or a SiON (silicon oxynitride) film that are used for an interlayer insulating film can be used. When the antireflection film is a multilayer, it is preferable that the refractive index decreases from the optical waveguide side towards the upper layer side.

Figure 2:
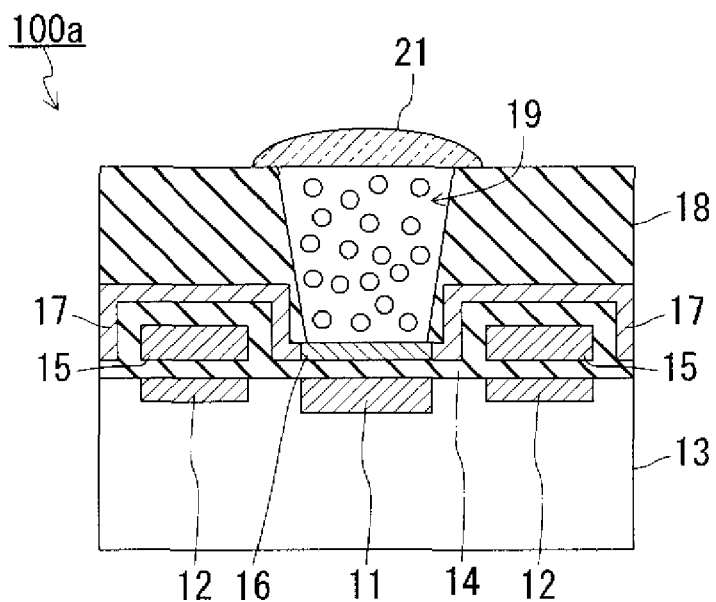
FIG. 2 is a cross-sectional view that schematically shows the other example of a solid-state imaging device of the present invention.

FIG. 2 shows an example of a solid-state imaging device in which an on-chip lens is formed on the optical waveguide. A solid-state imaging device 100*a* shown in FIG. 2 includes an on-chip lens 21 formed on the optical waveguide 19 as well as the configuration of the solid-state imaging device 100. The on-chip lens 21 further improves the light-condensing efficiency. The on-chip lens 21 can be made of, for example, a transparent resin or a transparent inorganic oxide.

Figure 3:
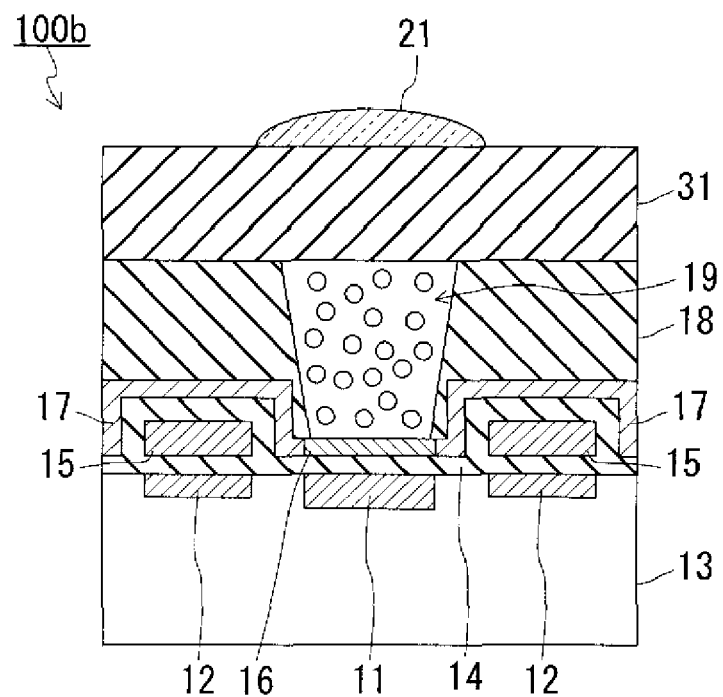
FIG. 3 is a cross-sectional view that schematically shows the other example of a solid-state imaging device of the present invention.

FIG. 3 shows another example of the solid-state imaging devices. A solid-state imaging device 100*b* shown in FIG. 3 includes a second interlayer insulating film 31 and the on-chip lens 21 as well as the configuration of the solid-state imaging device 100. The second interlayer insulating film 31 is formed so as to cover the interlayer insulating film 18 and the optical wave guide 19. The surface of the device is planarized by the second interlayer insulating film 31.

Figure 4:
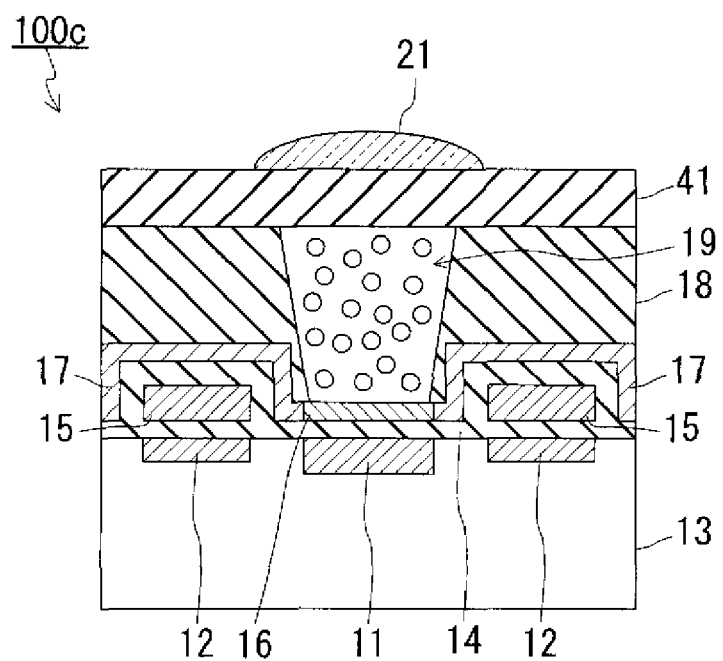
FIG. 4 is a cross-sectional view that schematically shows the other example of a solid-state imaging device of the present invention.

FIG. 4 shows another example of the solid-state imaging device. A solid-state imaging device 100*c* shown in FIG. 4 includes a color filter layer 41 and the on-chip lens 21 as well as the configuration of the solid-state imaging device 100. A well-known color filter layer can be used as the color filter layer 41.

Figure 5A:
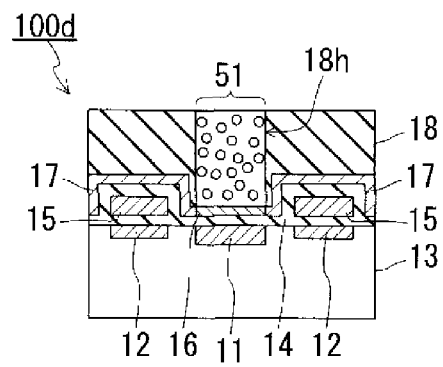
FIGS. 5A to 5C are cross-sectional views that schematically show other examples of a solid-state imaging device of the present invention.
Figure 5B:
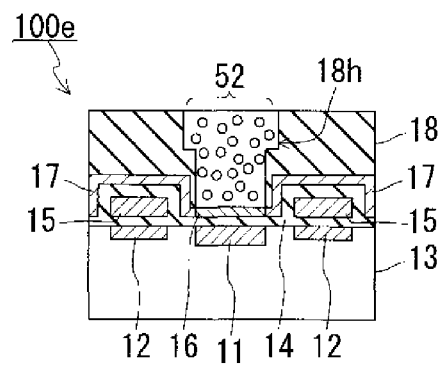
Figure 5C:
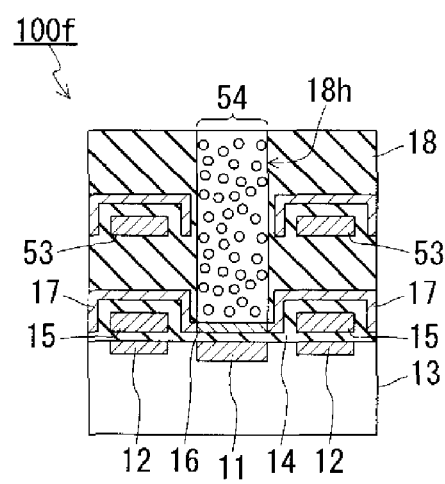

FIGS. 5A to 5C show examples of solid-state imaging devices equipped with optical waveguides having different shapes. A solid-state imaging device 100*d* shown in FIG. 5A includes a columnar optical waveguide 51 whose cross-sectional area in a direction parallel to the surface of the base 13 is almost constant. In this case, the side wall of the opening 18*h* is almost perpendicular to the surface of the base 13.

A solid-state imaging device 100*e* includes an optical waveguide 52 having a step-like sidewall. The cross-sectional area of the optical wave guide 52, which is parallel to the surface of the base 13, increases in a staircase pattern from the base 13 side.

A solid-state imaging device 100*f* shown in FIG. 5C includes electrodes 53 formed in the interlayer insulating film 18. An optical waveguide 54 of the device shown in FIG. 5C has a large aspect ratio. In the case of MOS-type solid-state imaging devices, optical waveguides having a large aspect ratio often are used, providing a large advantageous effect of the present invention.

When the optical waveguides are formed in the openings 18*h* shown in FIGS. 5A to 5C by a vapor phase deposition method such as CVD, voids often generates in the optical waveguides. However, almost whole of the openings shown in FIGS. 5A to 5C can be filled up with the composite material by using the after-mentioned method of the present invention.

Figure 6:
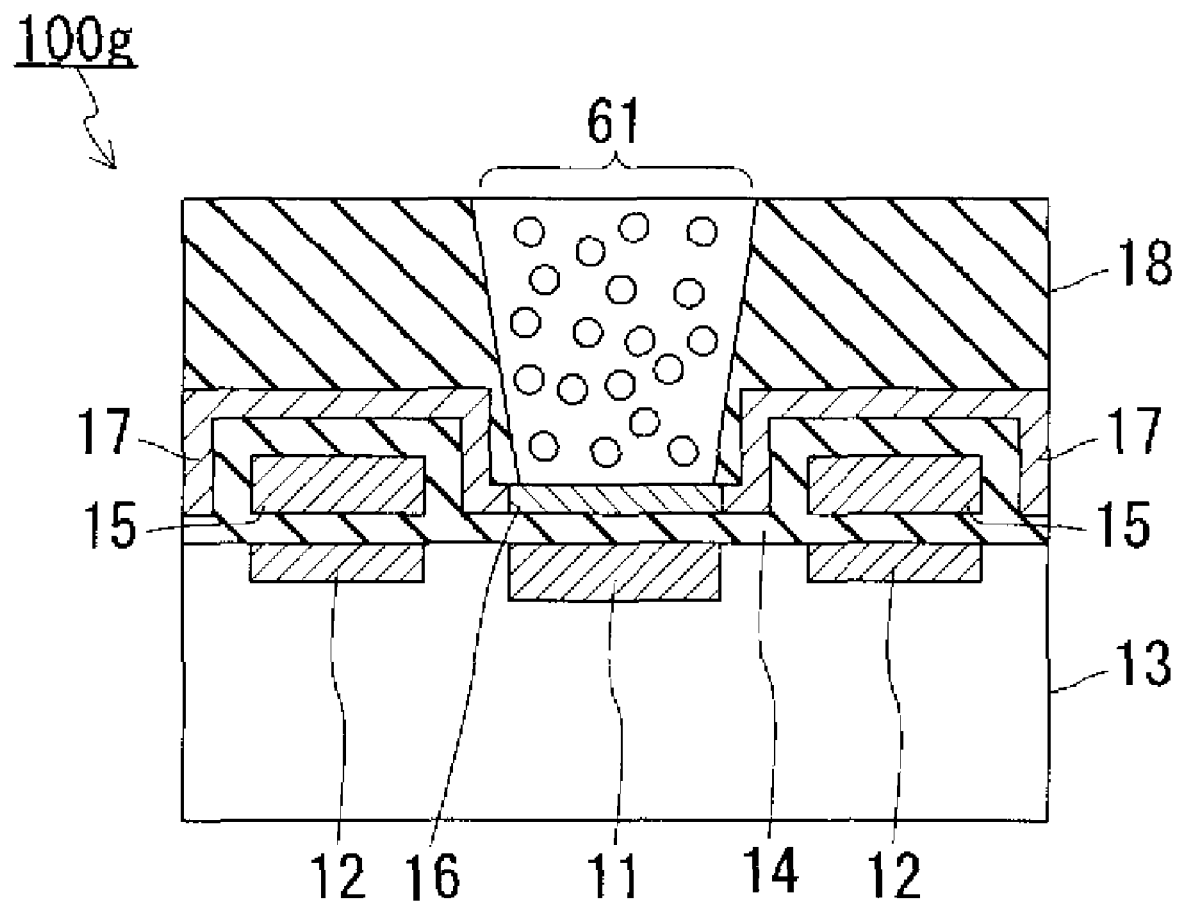
FIG. 6 is a cross-sectional view that schematically shows yet another example of a solid-state imaging device of the present invention.

FIG. 6 shows an example of a solid-state imaging device equipped with optical waveguides functioning as a color filter. A solid-state imaging device 100*g* shown in FIG. 6 includes an optical waveguide 61 functioning as a color filter. Other configuration except for the optical waveguide 61 is as same as the image sensing device 100.

In the imaging device 100*g*, light that has passed through the optical waveguide 61 enters the photoelectric conversion portion 11 to be detected. Therefore, only light in the desired range is detected and the effect of light in other range is extremely small. Accordingly, an image property that has little crosstalk between pixels and has a high color-reproducibility can be achieved. Furthermore, since the imaging device 100*g* does not need a color filter layer, manufacturing process can be simplified.

The optical waveguide functioning as a color filter can be made of, for example, a composite material that absorbs light in a specific wavelength range. For example, the resin may be colored by mixing a coloring matter such as dye and pigment into the resin. It is more preferable to dissolve a dye in the resin than to disperse particles such as pigment, because it has less effect on the dispersion of inorganic particles. Furthermore, inorganic particles made of a material that absorbs light in a specific wavelength range can be used. As these materials, materials generally used for a color filter can be used, and the preferable material can be selected according to the desired property.

Figure 7B:
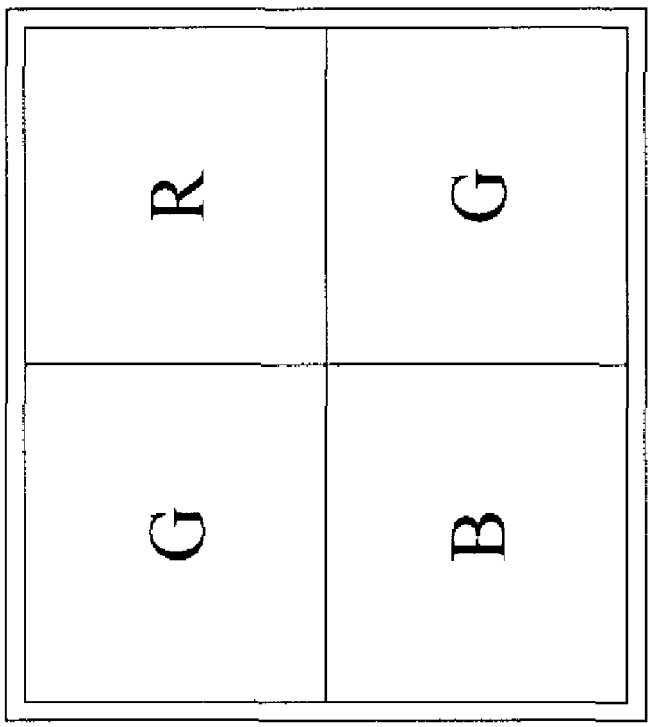
FIGS. 7A and 7B schematically show the examples of arrangement of color filters.
Figure 7A:
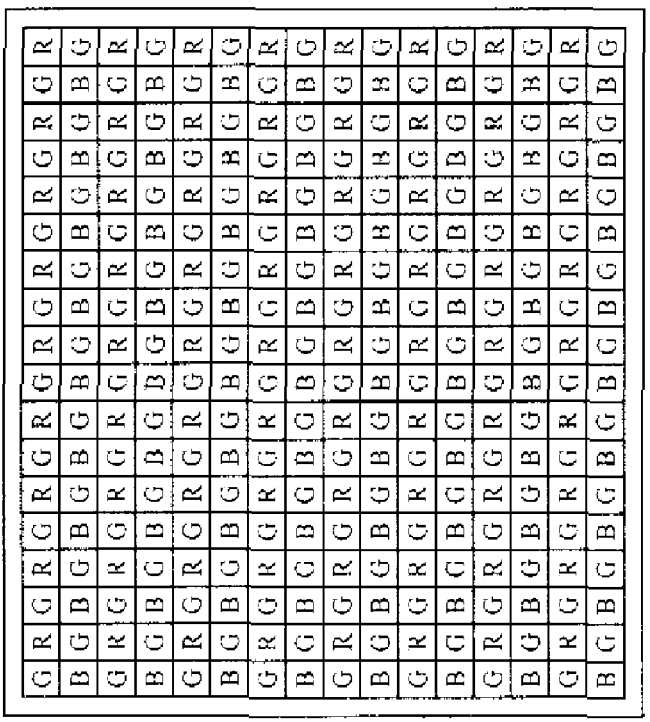

FIGS. 7A and 7B show examples of arrangement of color filters. In a Bayer arrangement shown in FIG. 7A, one of color filters of R, G and B is disposed in each pixel. In an arrangement shown in FIG. 7B, a solid-state imaging device is divided into four regions, and one of color filters of R, G and B is disposed in each region. The arrangement shown in FIG. 7B can be applied to a compound-eye camera module, which takes a picture by using four lenses corresponding to each color. In the case of using an optical waveguides functioning as color filters, the thickness of the imaging device can be reduced since the color filter layers can be omitted. In this case, a wide angle of view can be handled because of the high light-condensing efficiency achieved by the optical waveguide. Accordingly, a thin camera module can be achieved.

Furthermore, an optical waveguide having a function of an infrared light cut-off filter may be used. Such an optical waveguide can be made of a composite material that absorbs light in infrared range. For example, a resin containing a material that absorbs light in infrared range may be used. Specifically, a resin containing a complex salt of a metal ion such as copper ion may be used, and a resin in which dye such as cyanine dye that absorbs light in near infrared range has been dissolved may be used. Furthermore, inorganic particles made of indium tin oxide (ITO) and the like may be used.

Furthermore, an optical waveguide that functions as an ultraviolet light cut-off filter may be used. Such optical waveguide can be made of a composite material obtained by using a material that absorbs light in ultraviolet range. For example, a resin containing, within its molecule, an aromatic group that absorbs light in ultraviolet range may be used. Furthermore, inorganic particles made of zinc oxide and the like that absorbs light in ultraviolet range may be used.

<A Method of Manufacturing a Solid-State Imaging Device>

The manufacturing method of the present invention is a method of manufacturing a solid-state imaging device. Since materials and shapes of component parts formed by the manufacturing method have been mentioned above, redundant description may be omitted.

The manufacturing method includes step (i) of forming an insulating film above a base that has a surface having a plurality of photoelectric conversion portions formed therein. The photoelectric conversion portions can be formed by a well-known method, for example by doping impurity in a semiconductor substrate. A charge transfer portion and the like are formed as required before, after or during the formation of the photoelectric conversion portions. Furthermore, a transfer electrode, an antireflection film, a light shield film and the like may be formed as required after the formation of the photoelectric conversion portions. Furthermore, an insulating film different from the above-mentioned insulating film may be formed.

Next, openings are formed in the above-mentioned insulating film so that each of the openings is located above each of the photoelectric conversion portions (Step (ii)). The shape of the opening is determined according to the shape of the optical waveguide to be formed. The openings can be formed by a well-known method such as an etching treatment, an anisotropic etching treatment and a reactive dry etching treatment.

Next, optical waveguides having a higher refractive index than the insulating film are formed in each of the openings (Step (iii)). The optical waveguides are made of a composite material containing a resin and inorganic particles. Since the details about the composite material have been described above, redundant description is omitted.

The optical waveguide can be formed by using a mixture (for example, coating liquid) containing a material for making the composite material. The mixture (coating liquid) contains a resin or a raw material for a resin, inorganic particles, and solvent (dispersion medium). The optical waveguide may be formed by using a mixture not containing solvent. In this case, a thermoplastic resin is used, and a mixture whose viscosity has been made low by rising temperature or a mixture in a film shape is used. The coating liquid can be prepared by one of following methods (1) to (4).

(1) A method of preparing the coating liquid by diluting the composite material with solvent. In the case of using this coating liquid, the solvent is removed after applying the coating liquid.

(2) A method of preparing the coating liquid by mixing inorganic particles and a raw material for a resin such as monomer, oligomer and low molecular-weight polymer. In the case of using this coating liquid, it is necessary to synthesize the resin by reacting the raw material such as monomer, oligomer and low molecular-weight polymer. When to synthesize is determined according to the subsequent planarization process.

(3) A method of preparing the coating liquid by mixing a resin, solvent and a raw material for inorganic particles. In the case of using this coating liquid, after applying the coating liquid, the raw material for inorganic particles is made to react to synthesize inorganic particles in the coating liquid by a sol-gel process and the like.

(4) A method of preparing the coating liquid by dispersing inorganic particles in a resin whose viscosity has been made low by rising temperature. In this method, the coating film is solidified as the temperature of the coating film decreases, and thus the optical waveguide is formed.

One of these methods can be selected according to the coating liquid application method and materials of the resin and the inorganic particles. The coating liquid may include a cross-linking agent, a polymerization initiator, a dispersant and the like.

The method of disposing the mixture in the openings in the insulating film is not limited. For example, a well-known method can be applied. Specifically, an application method using an injection nozzle such as a dispenser, a jet application method such as an ink jet method, a spin application method such as spin coating, an application method with squeezing such as printing and transfer printing can be applied. Such methods can be conducted by using ready-made equipment.

After applying the coating liquid, the optical waveguide can be formed by removing the solvent. When the coating liquid contains a raw material (such as monomer or oligomer) for the resin or a raw material for the inorganic particles, those materials may be made to react, after application, to synthesize the resin and the inorganic particles as required. Furthermore, the optical waveguide may be formed by hardening a film formed by applying the coating liquid. Hardening treatment can be conducted by photo-curing, heat-curing, drying and the like.

In the manufacturing method of the present invention, the above-mentioned step (iii) may include steps of (iii-a) disposing a mixture containing a material for making the composite material in the openings under an atmosphere of reduced pressure, and (iii-b) filling up the openings with the mixture by increasing the pressure of the atmosphere. By using this method, openings with high aspect ratio or openings shown in FIGS. 5A to 5C easily can be filled up with the mixture, and an optical waveguide in which few voids exist can be formed.

In addition, after the step (iii-b), a surface of a film formed by the mixture and a surface of the insulating film may be planarized (Step (iii-c)). In this step, the composite material disposed in the area other than the openings 18h is removed. The planarization may be conducted by the steps of applying the coating liquid by a spin coat method and increasing the rotational frequency. Also, a method of grinding such as Chemical Mechanical Polishing (CMP), a method of etching using plasma, etchant and the like, and a method of removing the surplus portion by squeezing can be used. The application process may double as the planarization process. For example, in the case of conducting application by a spin coat method, application and planarization can be conducted at the same time by controlling depressurization and cancellation of depressurization.

FIGS. 8A to 8D schematically show a process for manufacturing the optical waveguide, which is one of the processes for manufacturing the solid-state imaging device of the present invention. Components other than the optical waveguide can be formed by well-known methods.

Figure 8A:
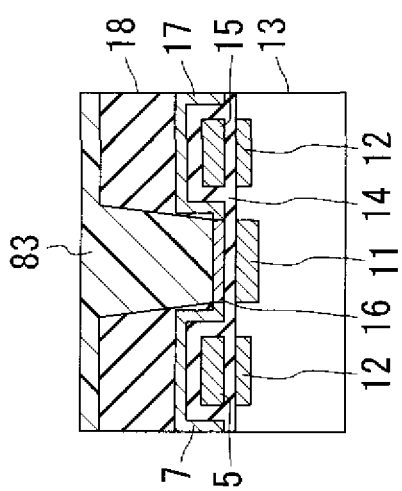
FIGS. 8A to 8D are process drawings showing an example of a method of the present invention for manufacturing a solid-state imaging device.

First, as shown in FIG. 8A, the opening 18h is formed in a portion in the interlayer insulating film 18 and the portion is located above the photoelectric conversion portion 11. Next, as shown in FIG. 5B, the substrate is set in a decompression container 81 and the inside of the decompression container 81 is depressurized. The pressure in the decompression container 81 needs not be lowered to the level required for vacuum process such as vacuum evaporation and CVD. For example, the pressure of about 1 Pa to 5000 Pa leads to sufficient advantageous effect, and the pressure of 100 Pa or less is preferable.

Next, a coating liquid 83 for making the composite material is applied on the interlayer insulating film 18 from an injection nozzle 82 in the depressurized decompression container 81. At the same time, the coating liquid 83 also is applied in the opening 18h. In this stage, a void 84 that is not filled up with the coating liquid 83 may exist in the opening 18h.

Figure 8C:
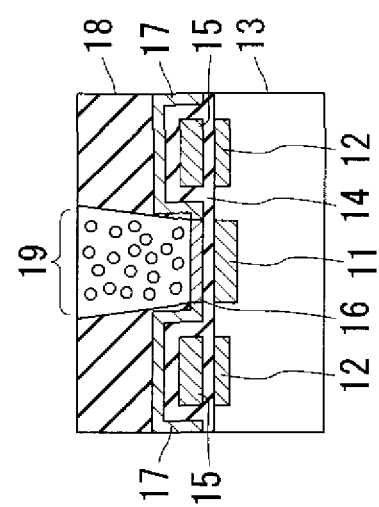
Figure 8B:
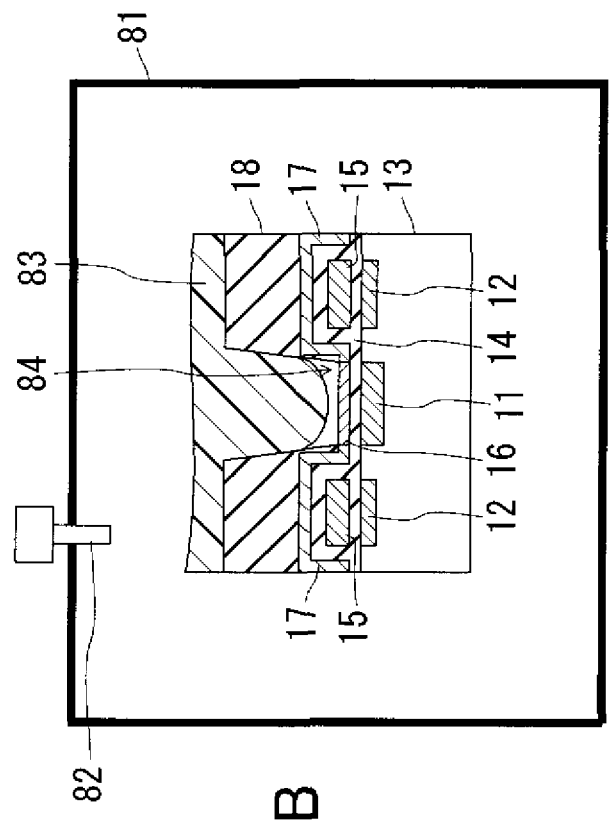
Figure 8D:
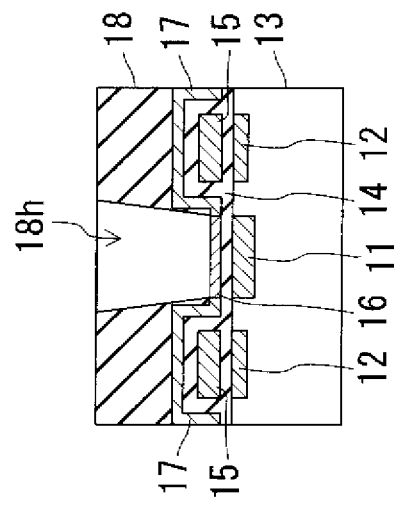

Next, the decompression container 81 is released from depressurization to be atmospheric pressure. Since the pressure in the void 84 is lower than atmospheric pressure, the void 84 becomes smaller as the pressure in the decompression container 81 approaches atmospheric pressure. As a result, almost the whole of the opening 18h is filled up with the coating liquid 83 (FIG. 8C). Thus, most of the void in the opening 18h disappears.

Next, as shown in FIG. 5D, the optical waveguide 19 is formed by planarizing a surface of the coating film formed by the coating liquid 83 and a surface of the interlayer insulating film 18.

Figure 9A:
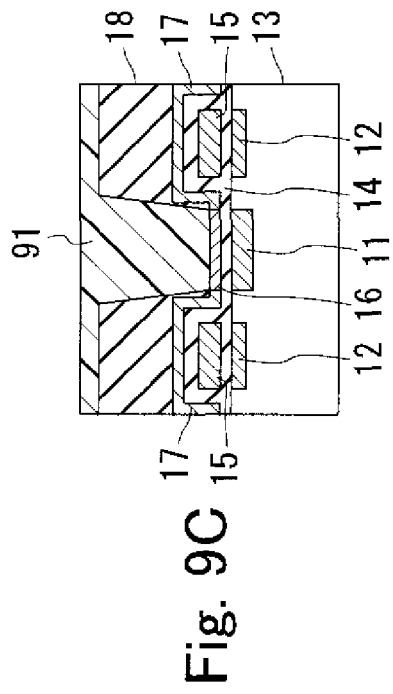
FIGS. 9A to 9D are process drawings showing another example of a method of the present invention for manufacturing a solid-state imaging device.
Figure 9B:
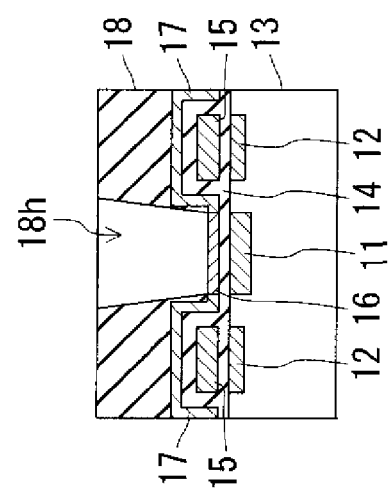
Figure 9C:
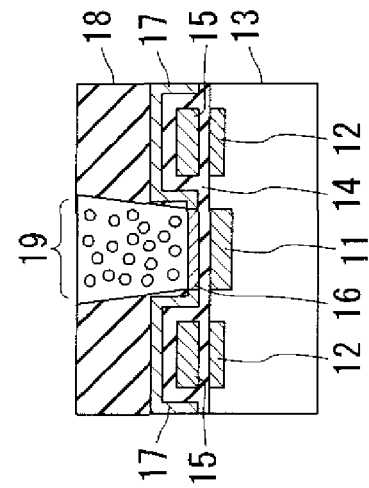
Figure 9D:
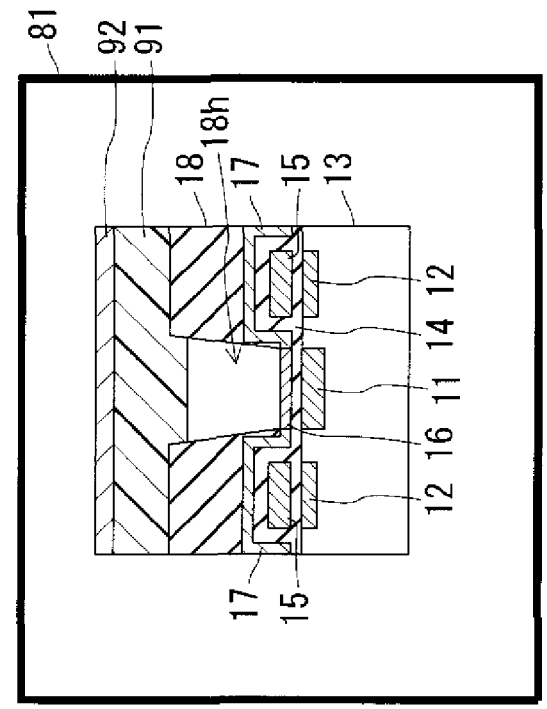

FIGS. 9A to 9D show another example of a method of forming the optical waveguide 19. In this example, as shown in FIG. 9B, a coating film 91 is transferred by bringing a transfer plate 92 on which the coating film 91 is formed into contact with the upper surface of the interlayer insulating film 19 under reduced pressure. The coating film 91 is a film made from a coating liquid for making the composite material. After transferring the coating film 91, the opening 18h is filled up with the coating film 91 as shown in FIG. 9C by releasing the reduced pressure in the decompression container 81. Next, as shown in FIG. 9D, the optical waveguide 19 is formed by planarizing a surface of the interlayer insulating film 18 and a surface of the coating film 91.

The series of the above-mentioned processes can be conducted at relatively low temperature. Therefore, the manufacturing method of the present invention is preferable, especially when manufacturing a solid-state imaging device that needs a low temperature process. For example, it is preferable when manufacturing a MOS-type solid-state imaging device equipped with aluminum electrodes.

According to the present invention, the optical waveguide can be formed without using a vapor phase deposition method such as Chemical Vapor Deposition (CVD) and vacuum evaporation. Therefore, the high vacuum required in such a vapor phase deposition method is not necessary. Accordingly, the optical waveguide can be formed in a short period of time with low energy.

<Optical Waveguide Forming Machine>

The optical waveguide forming machine of the present invention is a machine for forming an optical waveguide that is used in a solid-state imaging device and is made of a composite material containing a resin and inorganic particles. This machine includes an applicator for applying a mixture (for example, coating liquid) containing a material for making the composite material on a specific area under reduced pressure, and the machine includes a pressure controller for controlling a pressure of an atmosphere in which the mixture (for example, coating liquid) is applied. The optical waveguide forming machine is a machine for forming the optical waveguide made of the above-mentioned composite material.

As the applicator, a device for conducting the above-mentioned application method can be used. For example, vacuum injection devices, spin coating devices, screen printing devices, dispensers, ink jet devices and the like can be used. As the pressure controller, a well-known device can be used. For example, a device equipped with a sealed container capable of releasing the sealed state, a decompressor connected to the sealed container and a controller for controlling the pressure in the sealed container can be used. The optical waveguide forming machine further may include a device for planarizing the formed coating film.

Figure 10:
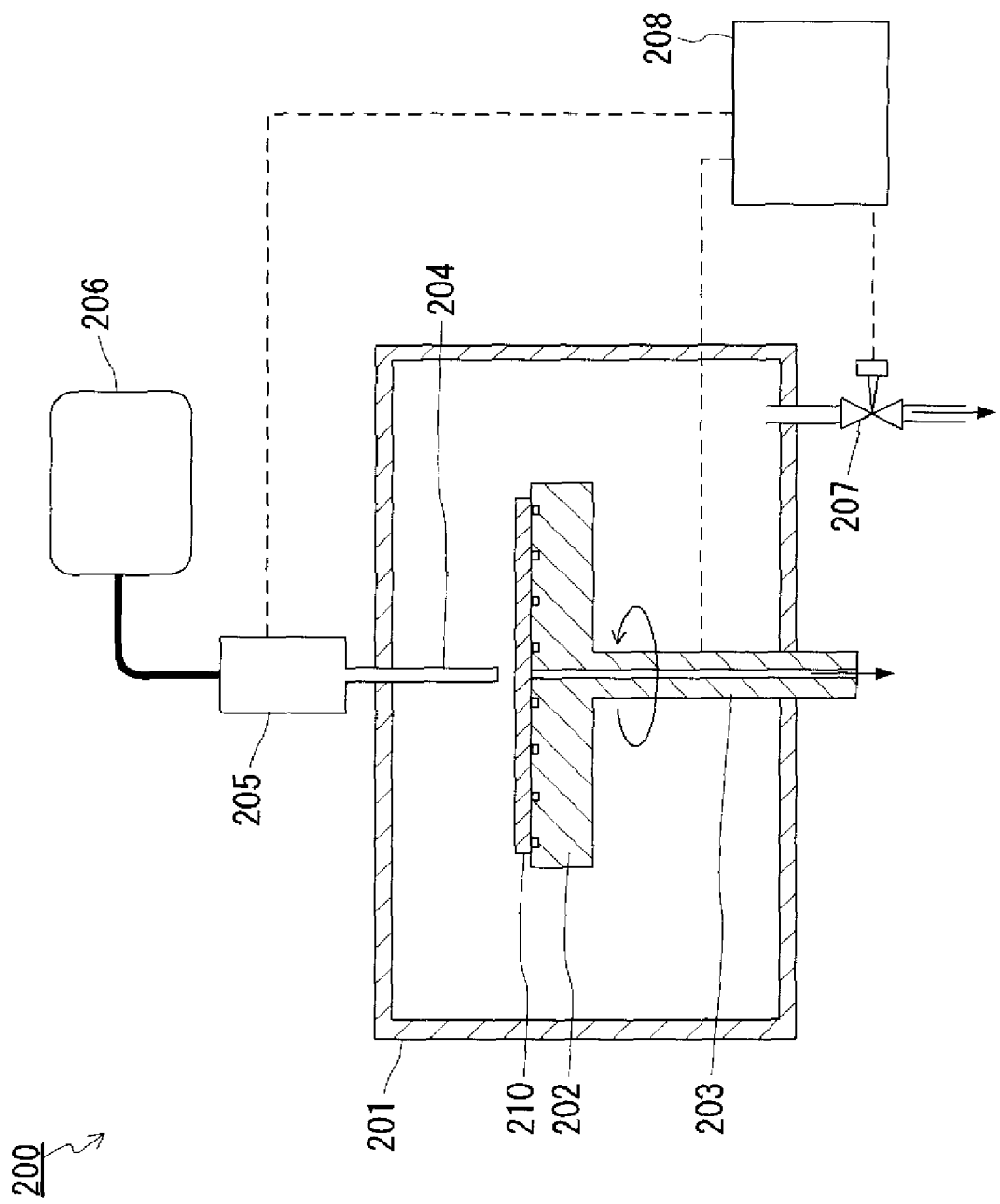
FIG. 10 schematically shows an example of an optical waveguide forming machine of the present invention.

FIG. 10 schematically shows a configuration of an example of the optical waveguide forming machine. The machine 200 in FIG. 10 includes a container 201, a substrate holding stage 202, a substrate rotating device 203, an injection nozzle 204, a vacuum injection device (head) 205, a coating liquid tank 206, a pressure controlling valve 207 and controller 208.

The container 201 can maintain a depressurized state and is connected with a decompressor (not shown). The substrate holding stage 202 is a stage for holding a substrate and is equipped with a vacuum chuck. The substrate holding stage 202 can be rotated by the substrate rotating device 203. The applicator is composed of the injection nozzle 204, the vacuum injection device 205 and the coating liquid tank 206. A coating liquid for forming the optical waveguide is put in the coating liquid tank 206. The pressure controlling valve 207 controls the pressure inside the container 201. The pressure controller is composed of the container 201, the decompressor and the pressure controlling valve 207. These devices are controlled by the controller 208 to form the optical waveguide.

Hereinafter, an example of a method for forming an optical waveguide by using the machine 200 is described. First, a substrate 210 is fixed on the substrate holding stage 202. The substrate 210 is fixed by lowering the pressure in the vacuum chuck than that in the container 201. The substrate 210 is the substrate shown in FIG. 8A, that is, the substrate including the interlayer insulating film 18 in which the opening 18h has been formed. The substrate 210 may be fixed by using a jig or by using static electricity.

Next, the inside of the container 201 is depressurized by using a decompressor and the pressure controlling valve 207, and then the coating liquid is applied on the interlayer insulating film 18 by using the injection nozzle 204 and the vacuum injection device 205. In this step, the coating liquid is applied uniformly by rotating the substrate holding stage 202 at a low speed. After that, the opening 18h in the interlayer insulating film 18 is filled up with the coating liquid by releasing the depressurization inside the container 201. According to these steps, the opening 18h can be filled up uniformly with the coating liquid without generating air space such as voids.

Next, the excessive coating liquid disposed on the interlayer insulating film 18 is removed by rotating the substrate 210 at a high speed using the substrate rotating device 203. Lastly, curing of the coating liquid is conducted. The series of these processes such as the depressurization process, the application process, the depressurization release process and the planarization process are controlled by the controller 208.

EXAMPLES

Hereinafter, an example of the solid-state imaging device of the present invention is described.

Example 1

First, photodiodes (photoelectric conversion portions) were formed by ion-implanting phosphorous (n-type dopant) in a p-type silicon substrate. Next, a silicon oxide film (insulating film) with a thickness of 20 nm was grown on the substrate by thermal oxidation. An aluminum oxide film (thickness: 60 nm) was formed on the insulating film by thermal CVD. The aluminum oxide film was deposited in a mixed gas atmosphere of Ar and $O_2$ at 450° C. using aluminum acetylacetonate. After that, an antireflection film made of aluminum oxide was formed above the photoelectric conversion portions by forming a resist pattern and etching the aluminum oxide film.

Next, a polysilicon film with a thickness of 300 nm was grown by low-pressure CVD. A part of the polysilicon film was etched selectively by dry etching to form a charge transfer electrode. Next, a silicon oxide film was formed on the charge transfer electrode by thermal oxidation, thereby covering the charge transfer electrode with an insulating film.

Next, a tungsten film that was to be a light shield film was formed on the whole area. The tungsten film was subjected to a resist pattern formation and anisotropic etching to form a light shield film covering the peripheral portion of the charge transfer electrode.

Next, an interlayer insulating film that doubled as a planarization film was formed by CVD. The interlayer insulating film was made of silicon oxide having a refractive index of 1.45. Next, a resist pattern was formed on the interlayer insulating film, and openings (width: 1 μm, depth: 2 μm) were formed above the photoelectric conversion portions by conducting anisotropic dry etching with $CF_4$. In this step, the aluminum oxide layer, which was an antireflection film, functioned as an etching stopper layer.

Thus, a substrate before forming the optical waveguides was prepared. Hereinafter, this substrate is also referred to as "substrate (A)".

Next, optical waveguides made of a composite material were formed in the openings in the interlayer insulating film of the substrate (A). Acrylic resin having a refractive index of 1.58 was used as a resin constituting the composite material, and titanium oxide particles having a diameter of about 30 nm and having a refractive index of 2.4 were used as inorganic particles. The content of the titanium oxide particles in the composite material was 32 vol. % and the refractive index of the composite material was 1.82.

The method of forming the optical waveguide is described below. First, the substrate (A) was fixed, with a pressure of 10 Pa, on a holding stage in a decompression container, and the pressure inside the container was fixed to 100 Pa. Then the coating liquid was applied on the substrate (A) using an injection nozzle, and spin coating was conducted by rotating the substrate (A) at 100 rpm for 10 seconds. The coating liquid was prepared by dispersing a predetermined amount of titanium oxide particles in a solution of acrylic oligomer (Urethane acrylate UN-7000B, manufactured by THE NIPPON SYNTHETIC CHEMICAL INDUSTRY Co., Ltd.).

After applying the coating liquid, depressurization inside the container was released so that the coating liquid filled up the openings sufficiently. After that, planarization was conducted by rotating the substrate (A) at 2000 rpm for 20 seconds. Lastly, the acrylic oligomer was transformed into an acrylic resin by light irradiation. Thus, optical waveguides made of the composite material were formed and the imaging device of Example 1 was obtained.

On the contrary, a solid-state imaging device in which the openings and the optical waveguides were not formed in the interlayer insulating film was formed as a comparative example. Sensitivity properties of thus obtained imaging devices, i.e. Example 1 and the comparative example, were evaluated. As a result, the image over the entire imaging device of Example 1 was twice as bright as that over the entire comparative example, and the imaging device of Example 1 had high sensitivity. This was attributed to the high light-condensing efficiency of the device of Example 1.

Furthermore, measurements about the relationship between the angle of the incident light and the entering efficiency of the incident light into the photoelectric conversion portion were made regarding the imaging devices of Example 1 and the comparative example. In the case of the imaging device of Example 1, assuming the efficiency of vertical incident light to be 100, the entering efficiency of the incident light tilted at a 20-degrees angle was about 70, and the entering efficiency of incident light tilted at a 30-degrees angle was about 50. By contrast, the light-condensing efficiency of the comparative example deteriorated severely as the incident angle became larger. Thus, it was confirmed that the formation of the optical waveguide contributed to remarkable improvement of the efficiency of detecting oblique incident light.

Furthermore, when the optical waveguide was formed using tantalum oxide particles, zirconium oxide particles, zinc oxide particles, indium oxide particles or tungsten oxide particles whose diameters were in the range of about 1 nm to 100 nm instead of using the titanium oxide particles, the sensitivity was improved similarly.

Example 2

In Example 2, an imaging device the same as Example 1 except for the optical waveguide was made. First, the substrate (A) described in Example 1 was prepared.

Next, optical waveguides made of a composite material were formed in the interlayer insulating film of the substrate (A). Acrylic resin having a refractive index of 1.58 was used as a resin constituting the composite material, and zirconium oxide particles having a diameter of about 30 nm and having a refractive index of 2.1 were used as inorganic particles. The content of zirconium oxide particles in the composite material was 35 vol. % and the refractive index of the composite material was 1.82.

The method of forming the optical waveguides is described below. First, the substrate (A) was fixed, with a pressure of 10 Pa, on a holding stage in a decompression container, and the pressure inside the container was fixed to 100 Pa. Then the coating liquid was applied on the substrate (A) using an injection nozzle, and spin coating was conducted by rotating the substrate (A) at 100 rpm for 10 seconds. The coating liquid was prepared by dissolving a predetermined amount of acrylic oligomer (Urethane acrylate UV-7000B, manufactured by THE NIPPON SYNTHETIC CHEMICAL INDUSTRY Co., Ltd.) in isopropyl alcohol solution in which zirconium oxide particles have been dispersed.

After applying the coating liquid, depressurization inside the container was released so that the coating liquid filled up the openings sufficiently. After that, planarization was conducted by rotating the substrate (A) at 2000 rpm for 20 seconds. Lastly, the acrylic oligomer was transformed into acrylic resin by light irradiation. Thus, optical waveguides made of the composite material were formed and the imaging device of Example 2 was obtained.

The evaluation of the sensitivity property showed that the sensitivity of the imaging device of Example 2 was about twice as high as that of the comparative example. Thus, it was confirmed the imaging device of the present invention had a high light-condensing efficiency.

Example 3

In Example 3, an imaging device the same as Example 1 except for the optical waveguide was made. First, the substrate (A) described in Example 1 was prepared.

Next, optical waveguides made of a composite material were formed in the openings in the interlayer insulating film of the substrate (A). Polyimide resin having a refractive index of 1.53 was used as a resin constituting the composite material, and tantalum oxide particles having a diameter of about 20 nm and having a refractive index of 2.2 were used as inorganic particles. The content of tantalum oxide particles in the composite material was 32 vol. % and the refractive index of the composite material was 1.80.

The method of forming the optical waveguide is described below. First, the substrate (A) was fixed, with a pressure of 10 Pa, on a holding stage in a decompression container, and the pressure inside the container was fixed to 100 Pa. Then a transfer plate on which a coating liquid had been applied was put on a surface of the substrate (A) and the depressurization inside the container was released, thereby filling up the openings sufficiently with the coating liquid. After that, the transfer plate was removed. The coating liquid was prepared by steps of mixing the pentaethoxytantalum in a solution containing polyamic acid resin (OPI-N3405, HITACHI CHEMICAL Co., Ltd.), that is a precursor of fluorinated polyimide resin, and forming tantalum oxide particles via sol-gel reaction.

Next, imidization was conducted at 300° C. under nitrogen gas flow to form a coating film containing polyimide resin. Next, the coating film formed on the interlayer insulating film was removed by CMP method. Thus optical waveguides were formed. Next, on-chip lenses made of a transparent resin having a refractive index of 1.53 were formed above the optical waveguides. Thus the imaging device of Example 3 was obtained.

The evaluation of the sensitivity property showed that the sensitivity of the imaging device of Example 3 was 2.5 times higher than that of the comparative example. Thus, it was confirmed that the imaging device of the present invention had a high light-condensing efficiency.

Example 4

In Example 4, an imaging device including optical waveguides functioning as color filters was made.

First, the substrate (A) described in Example 1 was prepared. Next, optical waveguides made of a composite material were formed in openings in the interlayer insulating film of the substrate (A). Polyimide resin having a refractive index of 1.53 was used as a resin constituting the composite material, and zirconium oxide particles having a diameter of about 50 nm and having a refractive index of 2.1 were used as inorganic particles. The content of zirconium oxide particles in the composite material was 35 vol. % and the refractive index of the composite material was 1.81.

The method of forming the optical waveguide is described below. First, the substrate (A) was fixed, with a pressure of 10 Pa, on a holding stage in a decompression container, and the pressure inside the container was fixed to 100 Pa. Then the coating liquid was applied on the substrate (A) using an injection nozzle, and spin coating was conducted by rotating the substrate (A) at 100 rpm for 10 seconds. The coating liquid was prepared by steps of dissolving 5 parts by weight of cyanine-type dye having a peak absorbance at 500 nm in 100 parts by weight of dimethylacetamide solution of polyamic acid resin (OPI-N3405, HITACHI CHEMICAL Co., Ltd.), that is a precursor of fluorinated polyimide resin, and dispersing zirconium oxide particles in the solution so that the content of the particles reached 32 vol. %.

After applying the coating liquid, the depressurization of the container was released to fill up the openings sufficiently with the coating liquid. After that, the substrate (A) was rotated at 2000 rpm for 20 seconds to conduct planarization. Next, imidization was conducted at 200° C. under nitrogen gas flow to form optical waveguides made of a composite material.

The sensitivity of the thus obtained imaging device according to the present invention was evaluated at wavelengths of 630 nm and 500 nm. Light at wavelength of 630 nm was detected but light at wavelength of 500 nm was not detected. These results show that optical waveguide functioned as a wavelength filter.

Furthermore, the sensitivity property at wavelength of 630 nm was evaluated. As a result, the sensitivity of the imaging device of Example 4 was about twice as high as that of the comparative example.

Example 5

In Example 5, an imaging device equipped with optical waveguides functioning as an infrared light cut-off filter was made.

First, the substrate (A) described in Example 1 was prepared. Next, optical waveguides made of a composite material were formed in the openings in the interlayer insulating film of the substrate (A). Acrylic resin having a refractive index of 1.58, which contained phosphate group and had an infrared light cut-off effect, was used as a resin constituting the composite material. And titanium oxide particles having a diameter of about 30 nm and having a refractive index of 2.4 were used as inorganic particles. The content of titanium oxide particles in the composite material was 32 vol. % and the refractive index of the composite material was 1.80.

The method of forming the optical waveguide is described below. First, the substrate (A) was fixed, with a pressure of 10 Pa, on a holding stage in a decompression container, and the pressure inside the container was fixed to 100 Pa. Then the coating liquid was applied on the substrate (A) using an injection nozzle, and spin coating was conducted by rotating the substrate (A) at 100 rpm for 10 seconds. The coating liquid was prepared by dispersing a predetermined amount of titanium oxide particles in a solution containing 100 parts by weight of acrylic oligomer (Urethane acrylate UV-7000B, manufactured by THE NIPPON SYNTHETIC CHEMICAL INDUSTRY Co., Ltd.), 1 parts by weight of [2-(methacryloyloxy)ethyl]phosphorylcholine and 1 parts by weight of copper bromide.

After applying the coating liquid, the depressurization of the container was released to fill up the openings with the coating liquid. After that, the substrate (A) was rotated at 2000 rpm for 20 seconds to conduct planarization. Lastly, thermal curing treatment was conducted to form optical waveguides made of the composite material. Thus the imaging device of Example 5 was obtained.

The evaluation of the sensitivity property showed the sensitivity of the imaging device of Example 5 was about twice as high as that of the comparative example. The sensitivity in infrared range of the imaging device according to the present invention decreased severely. This is attributed to the infrared light cut-off effect of the optical waveguides.

INDUSTRIAL APPLICABILITY

The present invention can be applied to solid-state imaging devices such as CCDs and MOS-type sensors and to devices using those imaging devices. The present invention can be applied to various applications such as digital still cameras, camcorders, cell phones with camera, scanners, digital copying machines and facsimile machines, for example.

The invention claimed is:
1. A method of manufacturing a solid-state imaging device, comprising steps of:
 (i) forming an insulating film above a base that has a surface having a plurality of photoelectric conversion portions formed therein,

(ii) forming openings in the insulating film so that each of the openings is located above each of the photoelectric conversion portions, (iii-a) disposing a mixture containing a material for making a composite material containing a resin and inorganic particles in the openings under an atmosphere of reduced pressure, and (iii-b) filling up the openings with the mixture by increasing the pressure of the atmosphere.

2. The method according to claim 1, wherein the pressure of the atmosphere in the step (iii-a) is in the range of 1 Pa to 100 Pa.

3. The method according to claim 1, wherein, in the step (iii-a), the mixture is disposed in the openings by applying the mixture on the insulating film and conducting a spin coating.

4. The method according to claim 1 comprising, after the step (iii-b), (iii-c) planarizing a surface of a film formed by the mixture and a surface of the insulating film.

5. The method according to claim 4, wherein the planarizing in the step (iii-c) is performed by rotating the base.

6. The method according to claim 1, wherein the material contains a raw material for the resin, and the raw material contains one selected from a group consisting of a monomer, an oligomer and a precursor.

7. The method according to claim 6, wherein the resin is a photocurable resin, and the method further comprises a step of curing the mixture in the openings by photo-curing after the step (iii-b).

8. The method according to claim 6, wherein the resin is a thermosetting resin, and the method further comprises a step of curing the mixture in the openings by heat-curing after the step (iii-b).

9. The method according to claim 1, wherein the resin is at least one resin selected from a group consisting of acrylic resin, epoxy resin, polyimide resin, butyral resin, non-crystal liquid polyolefin and polycarbonate resin.

10. The method according to claim 1, wherein the length L of each of the openings and the width W of the bottom of each of the openings fulfill $1 \leq L/W \leq 5$.

11. The method according to claim 1, wherein the openings have a taper shape whose cross-sectional area gradually decreases from the surface side of the openings to the bottom side of the openings, and an angle between a side wall of the openings and a surface of the base is 60° or more and less than 90°.

12. The method according to claim 1, wherein the openings have a taper shape whose cross-sectional area gradually decreases from the surface side of the openings to the bottom side of the openings, and an angle between a side wall of the openings and a surface of the base is 70° or more and 80° or less.

* * * * *